US012796414B2

(12) United States Patent
Polzinger et al.

(10) Patent No.: US 12,796,414 B2
(45) Date of Patent: Nov. 10, 2026

(54) METHOD FOR MANUFACTURING A CARRIER SUBSTRATE ON A SEMICONDUCTOR WAFER AND DEVICE INCLUDING A SEMICONDUCTOR WAFER

(71) Applicant: Robert Bosch GmbH, Stuttgart (DE)

(72) Inventors: Bernhard Polzinger, Stuttgart (DE); Christian Foerster, Reutlingen (DE); Jens Buettner, Reutlingen (DE); Kristina Vogt, Muenchingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 727 days.

(21) Appl. No.: 18/173,526

(22) Filed: Feb. 23, 2023

(65) Prior Publication Data

US 2023/0274928 A1 Aug. 31, 2023

(30) Foreign Application Priority Data

Feb. 25, 2022 (DE) ..................... 10 2022 201 974.1

(51) Int. Cl.

| | |
|---|---|
| ***H10P 90/00*** | (2026.01) |
| ***H10D 62/10*** | (2025.01) |
| ***H10P 50/00*** | (2026.01) |
| ***H10P 74/00*** | (2026.01) |

(52) U.S. Cl.

CPC ............. *H10P 90/12* (2026.01); *H10D 62/10* (2025.01); *H10P 50/00* (2026.01); *H10P 74/273* (2026.01)

(58) Field of Classification Search

None

See application file for complete search history.

(56) References Cited

U.S. PATENT DOCUMENTS

2018/0122990 A1 * 5/2018 von Malm ........... H10H 20/857

FOREIGN PATENT DOCUMENTS

DE 102015105509 A1 10/2016
EP 2725605 A2 * 4/2014 ............. H10D 62/10

* cited by examiner

*Primary Examiner* — Alexander G Ghyka

(74) *Attorney, Agent, or Firm* — NORTON ROSE FULBRIGHT US LLP

(57) ABSTRACT

A method for manufacturing a carrier substrate on a semiconductor wafer that includes a front side and a rear side, the front side being situated opposite the rear side, the front side representing a structured semiconductor wafer side including contact areas. The method includes the following steps: applying at least one first layer to the front side with the aid of printing technology, the at least one first layer including a first material that is water-insoluble, and curing the at least one first layer with the aid of UV radiation, thermally or with the aid of sintering.

7 Claims, 2 Drawing Sheets

METHOD FOR MANUFACTURING A CARRIER SUBSTRATE ON A SEMICONDUCTOR WAFER AND DEVICE INCLUDING A SEMICONDUCTOR WAFER

FIELD

The present invention relates to a method for manufacturing a carrier substrate on a semiconductor wafer and to a device including a semiconductor wafer.

BACKGROUND INFORMATION

Semiconductor components are produced with the aid of up to 600 individual process steps. In many cases, the semiconductor wafers must be ground very thin toward the end of the manufacturing processes A disadvantage of this is that the semiconductor wafers may exhibit intrinsic compressive and tensile stresses as a result of the various preceding individual processes and of structurings and deep etchings, for example, trench etching in the case of MOSFET/IGBT, so that the semiconductor wafers, once they are thinly ground, display a high mechanical bending. This uncontrollable and inhomogeneous bending hampers the further processing and greatly increases the risk of breakage to the point that the thin semiconductor wafers are no longer further processable. This affects both the handling of the wafers and the no longer possible vacuum suction of the thinned substrate which, however, is essential during the further processing.

The object of the present invention is to overcome this disadvantage.

SUMMARY

A method according to an example embodiment of the present invention for manufacturing a carrier substrate on a semiconductor wafer that includes a front side and a rear side, the front side being situated opposite the rear side, the front side representing a structured semiconductor wafer side including contact areas, includes the application of at least one first layer onto the front side with the aid of a printing technology, the at least one first layer including a first material that is water-insoluble, and the curing of the at least one first layer with the aid of UV radiation, thermally or with the aid of sintering.

An advantage of this is that the semiconductor wafer is mechanically stabilized for subsequent process steps and existing high stresses arising as a result of thick metal layers and passivation layers as well as deep trenches in the semiconductor wafer are offset, so that the semiconductor wafer is able to be processed in a process-safe manner up to the end of the process chain of the manufacture of the semiconductor component. This means that the wafer bow may be offset in a targeted manner, even locally limited, by a dedicated selection of the printing medium and of the printing processing, so that an unstrained composite made up of semiconductor substrate and carrier substrate may be implemented.

In one refinement of the present invention, openings of the at least one first layer, which partially expose the contact areas, are produced with the aid of a laser.

An advantage of this is that metallization surfaces and contact pads for PCM or WLT tests continue to remain contactable for test purposes after back thinning or after rear side metallization. This process step is also very cost-efficient.

In one further embodiment of the present invention, the at least one first layer includes a second material, which is applied with the aid of printing technology above the contact areas of the front side, openings of the at least one first layer, which partially expose the contact areas, being produced by removing the second material.

An advantage of this is that the openings have sharp or sharper contours, so that small openings are able to be implemented in the case of great layer thicknesses.

In one refinement of the present invention, a structured planarizing layer is applied to the front side, the structured planarizing layer filling in recesses of the front side.

An advantage of this is that the mechanical pressures during the final wafer processing and, specifically, during the mechanical back grinding of the wafers are better distributed since the pressure during the grinding process engages on a completed planarized topology, because unevenness on the surface of the printed carrier substrate may result in breakage or in an inhomogeneous wafer thickness after grinding.

In one further embodiment of the present invention, a media-soluble, thermally soluble or optically soluble layer is applied in areas on the front side. In other words, the layer may be removed from the actual semiconductor substrate by a suitable liquid, thermally, or by an optical excitation or may be dissolved itself as a result.

An advantage of this is that the carrier substrate may be easily removed after completion of the final wafer processing before or after wafer dicing.

In one further refinement of the present invention, the application of the at least one first layer takes place repeatedly, the at least one first layer having a layer thickness of at least 5 μm, in particular, a layer thickness of between 5 μm and 40 μm.

An advantage of this is that the carrier substrate exhibits a high stability, since a strained state is incorporated in a targeted manner into the carrier substrate by the printing medium and the printing processing.

In one further embodiment of the present invention, the application of the at least one first layer takes place with the aid of inkjet technology, LIFT technology, DLP technology or stereolithography, so that the at least one first layer includes a coating material.

An advantage of this is that the coating material or the coating substance or the coating medium may be applied locally precisely and directly calibrated to the semiconductor process via calibration marks, both laterally as well as in the z-direction. A stabilizing effect in the semiconductor wafer is induced by the solid form of the coating material in the target state. The advantage of this is that after the cross-linking, these materials are able to form a mechanically stable carrier or a mechanically stable carrier substrate having a defined geometry.

A device includes a semiconductor wafer that includes a front side and a rear side, the front side being situated opposite the rear side, and the front side representing a structured semiconductor wafer side including contact areas. According to an example embodiment of the present invention, at least one first layer is situated on the front side, the at least one first layer including a first material that is media-insoluble, and the at least one first layer functioning as a carrier substrate.

An advantage of this is that the semiconductor wafer is mechanically stabilized for the final wafer processing.

In one refinement of the present invention, the at least one first layer includes openings, so that the contact areas are partially exposed.

An advantage of this is that the contact areas are or remain contactable during the processing for test purposes.

In one refinement of the present invention, the at least one first layer has a layer thickness of at least 5 μm, in particular, a layer thickness of between 5 μm and 40 μm.

An advantage of this is that with variously thick layers of the printing medium of different materials and the post-treatment of these, it is possible to influence the stress management of the entire system in a targeted manner.

Further advantages of the present invention result from the following description of exemplary embodiments and from the rest of the disclosure herein.

BRIEF DESCRIPTION OF THE DRAWINGS

The present invention is explained below with reference to preferred specific embodiments and the figures.

DETAILED DESCRIPTION OF EXAMPLE EMBODIMENTS

Figure 1:
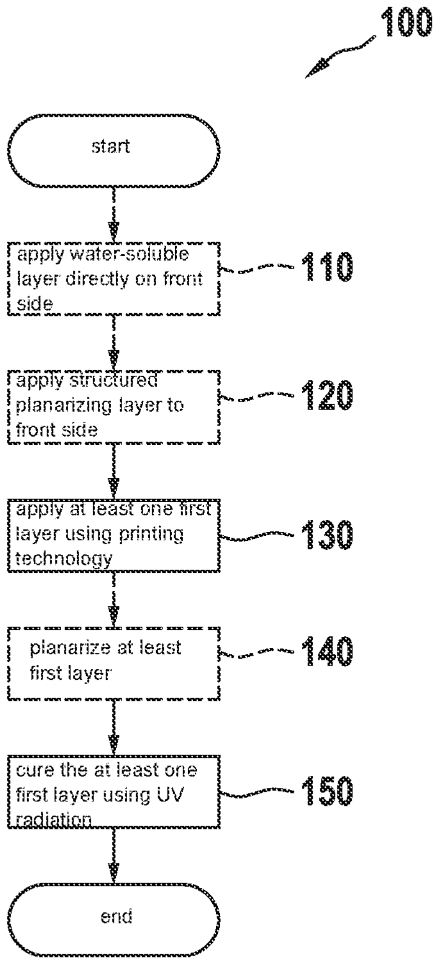
FIG. 1 shows a method for manufacturing a carrier substrate on a semiconductor wafer, according to an example embodiment of the present invention.

FIG. 1 shows a method 100 for manufacturing a carrier substrate on a semiconductor wafer, the semiconductor wafer including a front side and a rear side and the front side being situated opposite the rear side. The front side represents a structured semiconductor wafer side including contact areas. Method 100 starts with a step 130, in which at least one first layer is applied to the front side with the aid of printing technology and the at least one first layer is applied fully or includes openings, which partially uncover or expose the contact areas, the at least one first layer including a first material that is water-insoluble. In other words, a carrier layer or a carrier substrate is produced on the semiconductor wafer once the front side has been fully processed. To produce a thick carrier substrate, step 130 may be carried out multiple times in succession. This first layer may either be removed from the actual semiconductor substrate by a suitable liquid, thermally, or by an optical excitation, or may be dissolved itself as a result. In a following step 150, the at least one first layer is cured with the aid of UV radiation, thermally or with the aid of sintering. With repeated application of the first layer, a final hardening step or sintering step optionally takes place, so that a complete cross-linking of the first material is achieved, which improves the mechanical properties of the carrier substrate. Optionally, the at least one first layer is planarized with the aid of a doctor blade in a step 140, which is carried out between step 130 and step 150. The filling in of the topology precisely at the wafer edge and between metallization and passivation layers, including the organic passivation, for example, poly-IMID and the dicing path, achieves the goal of implementing a completely planar surface on the carrier substrate after the printing process.

Method 100 optionally starts with a step 120, which is carried out prior to step 130, a structured planarizing layer being applied to the front side. In the process, recesses of the front side are backfilled or filled in. Alternatively, method 100 optionally starts with a step 110, which is carried out prior to optional step 120 and prior to step 130, a water-soluble layer being applied to areas directly on the front side.

In a first exemplary embodiment, the at least one first layer is applied in a structured manner to the front side, so that openings above the contact areas are directly produced.

In a second exemplary embodiment, the at least one first layer is applied over the entire surface. The openings are subsequently produced with the aid of laser. Alternatively, the openings are produced using further lithographic processes and subsequent etching.

In a third exemplary embodiment, the at least one first layer includes a second material that is applied simultaneously with the first material, the second material being situated on the front side above the contact areas. The second material may be both media-soluble as well as thermally or optically soluble. The openings are produced as a function of the second material with the aid of a liquid medium in the event the second material is media-soluble and with the aid of optical or thermal excitation in the event the second material is media-insoluble.

The application of the at least one first layer takes place, for example, with the aid of inkjet technology, laser induced forward transfer (LIFT) technology, digital light processing (DLP) technology or stereolithography. The first material is media-insoluble and includes, for example, an inorganic polymer-based printing medium. The at least one first layer encompasses a layer thickness of at least 5 μm, in particular, a layer thickness of between 5 μm and 40 μm.

The carrier substrate may either be removed again immediately after the mechanical grinding process of the rear side of the wafer or it remains on the semiconductor wafer until the final manufacturing process step, the chip separation, and is removed from the wafer during the separation process with the aid of a process liquid such as a solvent bath and/or by the addition of additives and/or with the aid of optical radiation and/or by the addition of heat. Alternatively, two processes may be combined, for example, irradiation and solvent bath or addition of heat. In this way, it is possible to dispense with an abrasive film or protective film during laser annealing of the rear side. The carrier substrate offers an additional protection during the separation process, so that a protective coating is not required. The critical lamination and delamination in the case of very thin wafers is thus eliminated.

Figure 2:
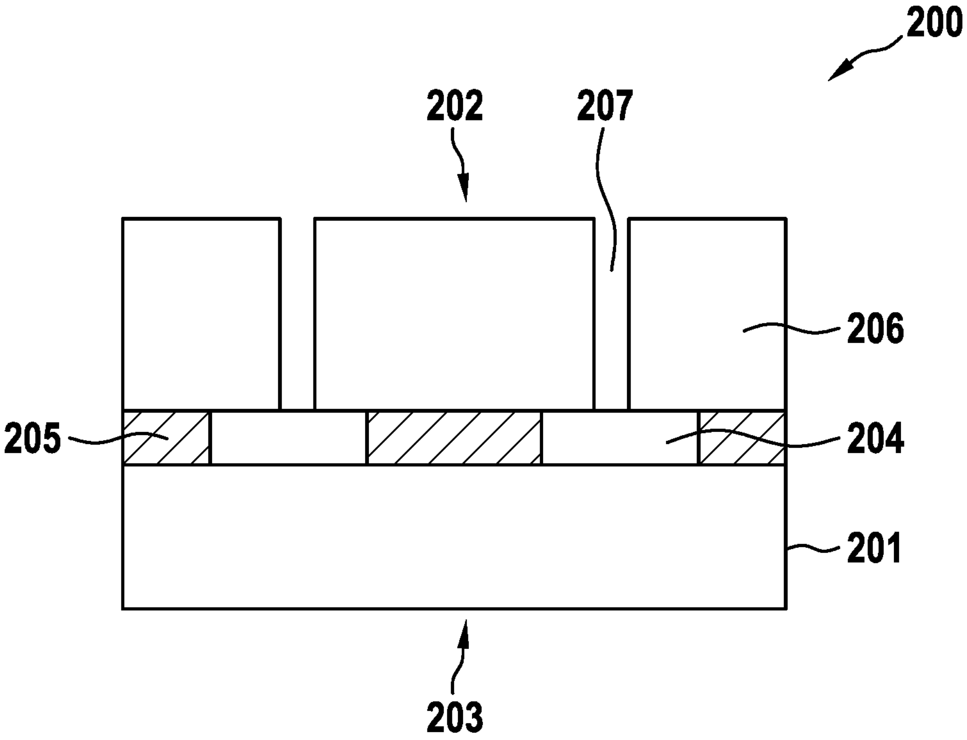
FIG. 2 shows one exemplary embodiment of a device that includes a semiconductor wafer, according to an example embodiment of the present invention.

FIG. 2 shows an exemplary embodiment of a device 200 including a semiconductor wafer 201, which includes a front side 202 and a rear side 203. Front side 202 is situated opposite rear side 203. Active areas of semiconductor components, which include contact areas 204, are situated on front side 202. A structured planarizing layer 205 is optionally situated on front side 202, which offsets recesses on front side 202. At least one first layer 206 functioning as a carrier substrate is situated on contact areas 204. The at least one first layer 206 includes openings 207. Alternatively, first layer 206 is applied to entire contact areas 204. In this way, the carrier substrate may entirely or partially cover or overlie the semiconductor chip.

Figure 3:
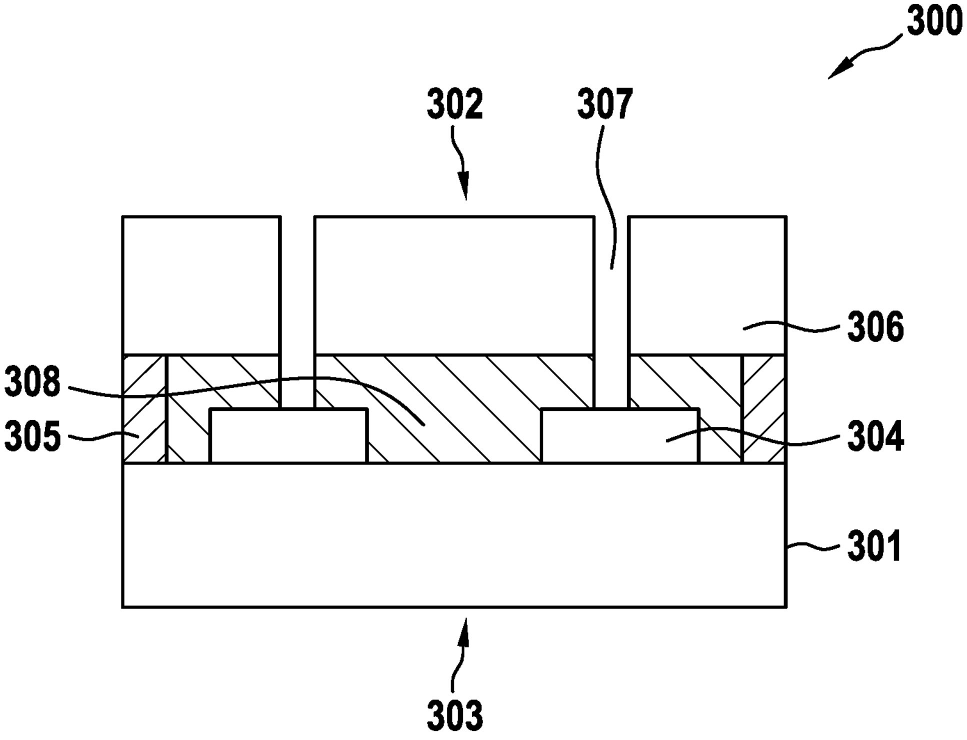
FIG. 3 shows a further exemplary embodiment of a device that includes a semiconductor wafer, according to an example embodiment of the present invention.

FIG. 3 shows a further exemplary embodiment of a device 300 including a semiconductor wafer 301. Identical rear positions of the reference numerals in FIG. 3 denote the same features as those in FIG. 2. Device 300 also includes a water-soluble layer 308 on front side 302, which serves as a sacrificial layer for removing the carrier substrate after completion of the rear side processes.

The carrier substrate is temperature-stable, high vacuum-suitable and does not warp.

Semiconductor wafer 201 and 301 has, for example, a diameter of 150 mm, 200 mm or 300 mm and includes, for example, silicon, silicon carbide, sapphire or QST for gallium nitride components.

Semiconductor wafer 201 and 301 is rounded off in the edge area. The rounded area is planarized and is topologically filled by the printing medium, so that a planar carrier substrate is formed. The planarization takes place with the layer applied directly to the front side. This may be both the planarizing layer as well as the at least one first layer 206 and 306. In other words, the front side of the semiconductor wafer is planarized before a closed layer is applied. In this case, the optional organic or inorganic planarizing layer 205 and 305 serves to reduce the wafer bow.

The at least one first layer 206 and 306 is a printing medium, i.e., is produced with the aid of printing technology. The printing medium includes organic or inorganic, for example mineral or ceramic, fillers. In other words, the printing medium includes a coating material, which is applied in liquid or paste-like form and becomes a solid layer as a result of the subsequent curing process.

The printing medium including the inorganic components in this case is polymer-based, for example. The layer thickness of the at least one first layer 206 and 306 is 5 μm to 40 μm with a one-time application. The carrier substrate may have a layer thickness of up to 1000 μm as a result of repeated applications of first layers 206 and 306.

The contact areas 204 and 304 are exposed by openings 207 and 307 in the at least one first layer 206 and 306 in such a way that the resulting semiconductor components are able to be tested during the further finishing processes. The at least one first layer 206 and 306 in this case functions as an insulator, so that multiple test heads may be used in the measurements and the risk of an electrical flashover in the case of breakdown voltages >1 kV is reduced.

Device 200 and 300 is used in the manufacturing of power semiconductor components and power semiconductor modules, which have a chip thickness of less than 180 μm during the processing.

What is claimed is:

1. A method for manufacturing a carrier substrate on a semiconductor wafer that includes a front side and a rear side, the front side being situated opposite the rear side, the front side representing a structured semiconductor wafer side including contact areas, the method comprising the following steps:

applying at least one first layer to the front side using printing technology, the at least one first layer including a first material which is water-insoluble; and curing the at least one first layer using UV radiation or thermally or using sintering, wherein the at least one first layer includes a second material, which is applied to the front side above the contact areas using printing technology, openings of the at least one first layer, which partially expose the contact areas, being produced by removing the second material.

2. The method as recited in claim 1, further comprising: producing, using a laser, openings of the at least one first layer, which partially expose the contact areas.

3. The method as recited in claim 1, further comprising: applying a structured planarizing layer to the front side, the structured planarizing layer filling in recesses of the front side.

4. The method as recited in claim 1, wherein a media-soluble layer or a thermally soluble layer or an optically soluble layer is applied directly to areas on the front side.

5. The method as recited in claim 1, wherein the application of the at least one first layer takes place repeatedly, the at least one first layer having a layer thickness of at least 5 μm.

6. The method as recited in claim 5, wherein the layer thickness is between 5 μm and 40 μm.

7. The method as recited in claim 1, wherein the application of the at least one first layer takes place using inkjet technology or LIFT technology or DLP technology or stereolithography, so that the at least one first layer includes a coating layer.

* * * * *